United States Patent [19]
Vanoli

[11] Patent Number: 5,898,812
[45] Date of Patent: Apr. 27, 1999

[54] APPARATUS AND METHOD FOR HOUSING HIGH HEAT EMISSION ELECTRO-OPTICAL COMPONENTS

[75] Inventor: Stefano Vanoli, Verdellino, Italy

[73] Assignee: Pirelli Cavi S.p.A., Italy

[21] Appl. No.: 08/822,506

[22] Filed: Mar. 24, 1997

[30] Foreign Application Priority Data

Apr. 5, 1996 [IT] Italy .................................. MI96A0670

[51] Int. Cl.⁶ ...................................................... G02B 6/36
[52] U.S. Cl. ............................................................ 385/135
[58] Field of Search ............................... 385/134, 88–94, 385/135

[56] References Cited

U.S. PATENT DOCUMENTS

| | | | |
|---|---|---|---|
| 5,117,476 | 5/1992 | Yingst et al. | 385/88 |
| 5,202,943 | 4/1993 | Carden et al. | 385/92 |
| 5,436,997 | 7/1995 | Makiuchi et al. | 385/92 |
| 5,537,502 | 7/1996 | Patel et al. | 385/92 |
| 5,740,293 | 4/1998 | Van Roemburg et al. | 385/92 |

*Primary Examiner*—Hung N. Ngo
*Attorney, Agent, or Firm*—Norris McLaughlin & Marcus; L. P. Brooks

[57] ABSTRACT

An optoelectronic apparatus includes a casing and an optical unit (300) on which at least one component (300) having high heat emission is disposed. This component is initially linked with clearance with the optical unit, by first fastening means, and in a second step by second fastening means the component is fixedly secured to the casing in a thermal contact state.

14 Claims, 5 Drawing Sheets

APPARATUS AND METHOD FOR HOUSING HIGH HEAT EMISSION ELECTRO-OPTICAL COMPONENTS

DESCRIPTION

The present invention relates to the optoelectronic device packaging field, and in particular to an apparatus and method for housing high heat emission electro-optical components in an optoelectronic apparatus.

Optoelectronic apparatuses are devices used to optically generate, scan or modify (that is without conversion to electrical signals or signals of another kind) the lightwave signals transmitted along an optical fiber line. Belonging to this class are for instance optical amplifiers, optical pre-amplifiers, fiber lasers, optical spectrum scanners, filters and optical switches in planar optics, e.g. of lithium niobate and the like.

In particular the so-called "fiber" amplifiers are known, in which the amplifying element consists of an active optical fiber length, obtained by doping with particular substances (typically rare earth elements). Over this fiber length, the optical signal is amplified, using pumping light energy supplied from laser sources.

Sometimes, amplification is divided into two amplification stages, that is comprising two distinct active optical fiber lengths. Two-stage optical amplifiers are known from U.S. Pat. No. 5,115,338 and European Patent Application EP 0509577 incorporated by reference herein.

Assembly of optoelectronic apparatuses, in particular two-stage or multi-stage optical amplifiers, surely is a not simple operation, above all due to the great number of splicings between optical fibers to be made. In addition, difficulties are increased and made still worse, due to the requirement of keeping the apparatus bulkiness to a minimum.

To the purposes of the present application, by optical component it is meant a component operating on optical signals without any electrical supply or control, such as for example an active fiber, optical coupler, optical isolator.

By electro-optical component instead it is meant a component operating on an optical signal requiring an electrical supply or control, such as for example a semiconductor laser, photodiode or tunable optical filter and the like.

An active fiber optical amplifier comprises several different electrical, electrooptical and optical components. Among the optical components there is at least one active fiber, one or more optical couplers and optionally optical isolators. Among the electro-optical components there is at least one pumping laser and optionally one or more monitoring diodes. Electric components are comprised of feeding and control circuits. All components must find a location in the amplifier casing.

The electric components are usually arranged on one or more boards, together with the electrooptical components. Arrangement of the electric circuits does not involve any particular problems and is made in the same manner as in any kind of electrical apparatus, by means of printed circuits on the same board or by cables joined to appropriate terminals on the boards.

On the contrary, due to the structural constraints imposed by optical fibers, arrangement of optical components such as active fibers, isolators, couplers and the like appear to be more delicate.

In fact, optical fibers can be bent only to a minimum radius of curvature, otherwise signal attenuations or even damages to the fiber structure occur. In addition, connections between different fibers are carried out by appropriate apparatuses carrying out an intimate connection of the two fiber ends by butt-splicing, so as to minimize the signal attenuations due to connections. Each splicing thus made is encapsulated in a cylindrical protection casing, thus embodying an optical connection component.

Finally, each optical or electrooptical component is provided with fiber lengths for connection with other components. These fiber lengths (currently referred to as "pig-tails") have a certain length to enable repeated splicings in case of errors or repositionings (a component devoid of a pig-tail or in which the pig-tail is too short is no longer usable) and the amplifier casing must therefore have sufficient room for housing these fiber lengths, usually referred to as surplus fiber.

In addition, for execution of a splicing operation the use of appropriate apparatuses in a position close to the amplifier casing is required, externally of same, due to bulkiness. For this reason too the availability of a sufficient fiber length is required for access from the amplifier to said apparatus during the assembling step.

Arrangement of the optical components within the casing of an active fiber optical amplifier must take all these requirements into account.

Usually, housings for one or more coils of active fiber and means for partly winding the pig-tails (spools or the like) are provided; the location of the remaining components depends on the arrangement of the active fiber and pig-tails. Often, the different passive components and splices are disposed in the casing in a rather disorderly manner, and assembling is therefore particularly complicated. In addition, fastening of the components may appear unsafe, as it is for example obtained by means of hooks and/or a silicone-based bonding agent.

European Patents No. EP-0595395 and No. EP-0595396 disclose active-fiber optical amplifiers in which an appropriate arrangement of the components has been conceived so as to minimize the amplifier bulkiness, in order to facilitate insertion thereof into cabins or cabinets. In these amplifiers, the presence of two separate units is provided: i) one optical unit having specific housings variously disposed within the unit, for active and passive optical components, electro-optical components and splices, and ii) one electronic unit in which the electric and electronic components are housed.

However, in the above mentioned European patents, optical units are described in which the component arrangement is directed towards achieving a reduction in the overall bulkiness of the amplifier, rather than making assembling and servicing of said units simpler and safer.

In the Italian Patent Application No. MI94A002531 which corresponds to U.S. Pat. No. 5,668,909, incorporated by reference herein a particular container is on the contrary described for housing components in an optical unit of an active fiber amplifier. This container is formed of some box shaped elements into which active optical components, passive optical components and splices are respectively inserted. In addition, the element holding the passive optical components contemplates the use of housings of previously defined sizes for arranging them. The shape and sizes of the housings are dictated by the shape and sizes of the optical components to be inserted therein; possible differences (in terms of smaller components) can be compensated for by perforated connecting caps of elastic material to be fitted onto the component before it is inserted into the grooves.

In this case, the optical components and splicings are protected by closed boxes and the surplus fibers are disposed within the optical unit of the amplifier, in the areas unoccupied by the boxes. In particular, the presence of many closed boxes holding the components, some of which also stacked upon each other, makes the access to the desired components complicated. In addition, once the optical unit has been opened, the surplus fiber, due to its elasticity, appears to be a hindrance to assembling and servicing operations.

Finally, components having a high heat dispersion, such as pump lasers, are housed within optoelectronic apparatuses without paying attention to how the produced heat is dissipated to the outside, this being an important problem in that a bad heat dissipation causes damages both to the component and the whole apparatus.

Accordingly, the present invention aims at providing an optoelectronic apparatus in which arrangement of the components having a high heat dispersion in the optical unit of the optoelectronic apparatus maximizes the heat dispersion of the components to the outside, while at the same time enabling completion of the optical unit and making it testable without important inconveniences.

Therefore, the present invention relates to an optoelectronic apparatus comprising a casing and an optical unit on which at least one component having a high heat emission is disposed, characterized in that it comprises first fastening means to link said component with clearance with said optical unit and second fastening means to link said component with said casing in a thermal contact state.

The accomplishment of a system for linking one component, carried out in two distinct steps enables the achievement of an optical unit that initially (i) has the availability of all required components for carrying out tests and keeps said one component fixed to the optical unit with sufficient clearance so as to enable a small movement of said one component, while at the same time avoiding accidental displacements of same from its seating when tests are being carried out. It has been found that during this initial step of a limited duration, the clearance to which the component is subjected is not a particular source of inconveniences.

In the second step (ii), when the tested optical unit is assembled in the optoelectronic apparatus for final tests and subsequent distribution, the component is fixedly linked, in contact with the casing, and the small clearance is eliminated so that it is disposed in a close thermal-contact state. In this manner thermal dispersion to the outside is maximized and at the same time no risks exist that repetition of the small movement of the component over a long period of time may cause damages to the optical unit and/or the apparatus.

Preferably said apparatus is comprised of support means cooperating with said first and second fastening means for linking said at least one component. By this particular fastening system, the drawback (dimensional incompatibility) resulting from the requirement of linking the same element (component) with two different supports (optical unit and casing) is overcome.

Typically, said clearance is smaller than a value stressing said optical fiber in a detrimental manner and greater than a value inhibiting an appropriate thermal contact between said component and casing once linked. In addition, application of said first fastening means takes place between said at least one component and said support means and application of said second fastening means takes place between said support means and casing.

In a preferred embodiment of the present invention, said support means comprises at least one T-shaped element having one leg and two arms and said at least one component comprises one central body and one flange. Preferably, said first fastening means is applied between the flanges of said at least one component and the leg of said element, and said second fastening means is applied between the arms of said element and said casing. Typically, said casing is made of a metal material.

In another aspect of the present invention a method of assembling an optoelectronic apparatus comprising a casing is provided which comprises the following steps:

disposing one component having a high heat emission on an optical unit of said apparatus;

linking said component with said optical unit with clearance;

inserting said optical unit into said casing;

linking said component with said casing in a thermal contact state; and linking said optical unit with said apparatus.

Preferably, in said linking with clearance step, first connecting means is applied between support means previously arranged on said optical unit and said component. Typically, said step carrying out linking in a thermal contact state contemplates the application of second connecting means between said support means and casing.

The present invention will be described hereinafter, by way of example, with reference to the accompanying drawings, in which.

It is to note that the number and type of the components shown within the optoelectronic apparatus is not to be considered in a limiting sense in connection with a specific configuration. To the ends of the invention the particular combination performed with any number of different components is quite irrelevant. In fact, the same teachings can be, for example, used when an optical amplifier, optical pre-amplifier, fiber laser, optical spectrum scanner or optical filter in planar optics and the like is to be made.

Figure 1:
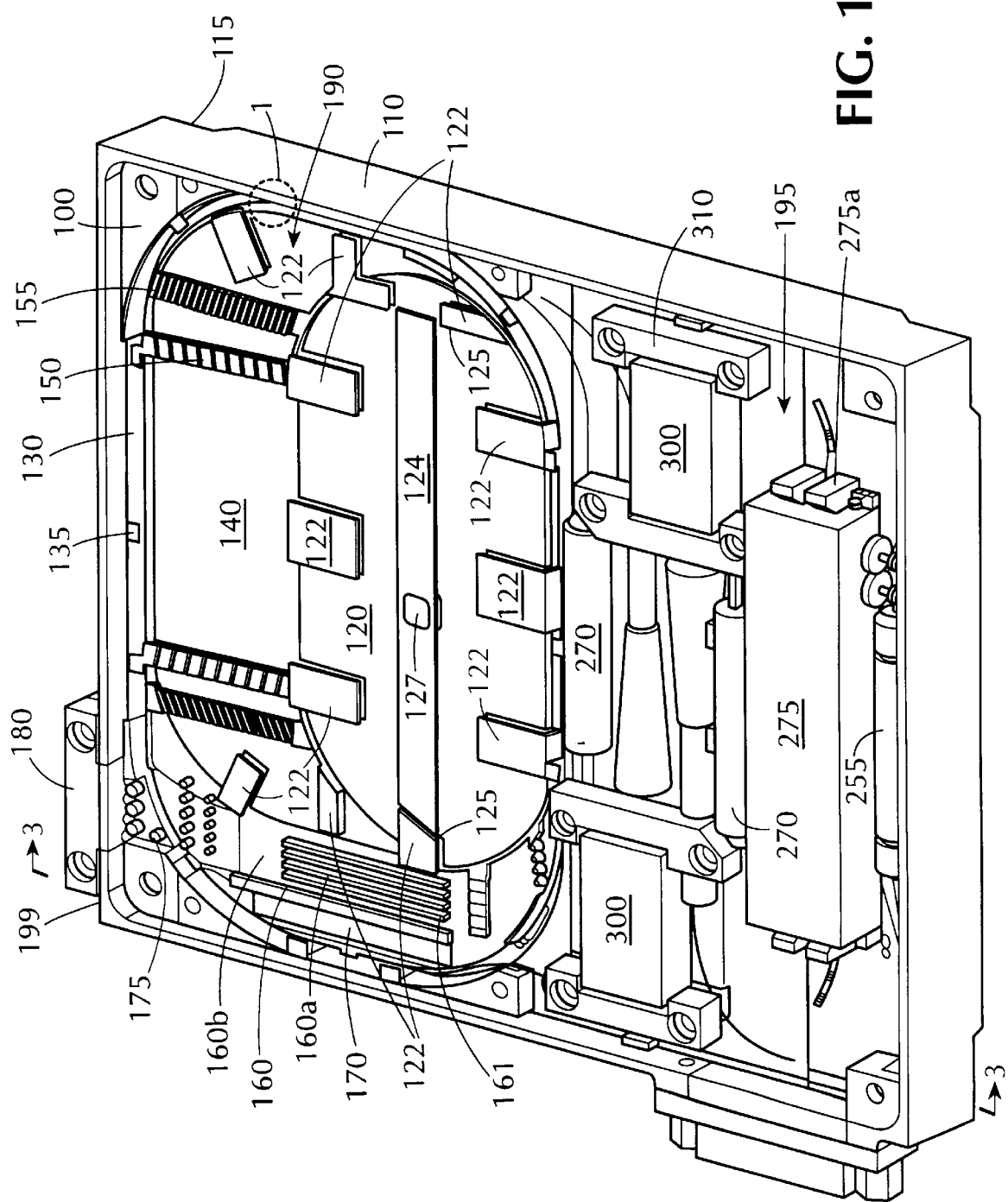
FIG. 1 is a perspective top view of an optical unit of an optoelectronic apparatus in accordance with one embodiment of the present invention.

Shown in FIG. 1 is an optical unit comprising optical components (such as active-optical fiber lengths, isolators, wavelength-selective couplers, directional couplers), optical connection components (such as splices and surplus fiber) and electro-optical components (such as semiconductor lasers, photodiodes and tunable optical filters) arranged on an organizer frame 100.

The optical unit is housed in a container 110, which preferably is externally provided with a recess 115 close to the corners, to enable connection with external elements, a card for example, without increasing the container 110 height.

Frame 100 is divided into different separated and dedicated areas or surfaces, that is areas on which components mainly of the same type can be arranged. In particular, shown in FIG. 1 is an area 190 on which the optical-connection components are gathered, that is splicings on optical fiber lengths provided with their protection jackets and surplus fibers, and an area 195 on which the electro-optical components are disposed.

In more detail, in the area 190 there is an interface 180 constituting the access or exit element of the optoelectronic apparatus for the optical fibers, not shown in the figure, which interface, by linking the fibers, enables transmission of axial tensile stresses from the fiber lengths located externally to those located internally. Preferably, to this end an elastic inner coating is adopted, of elastomeric material such as a silicone based resin for example, so that an appropriate protection against axial tensile stresses is ensured to the inner fiber lengths and at the same time the fiber length fixed to the interface 180 undergoes a reduced pressure incapable of damaging the optical behavior thereof.

Figure 2:
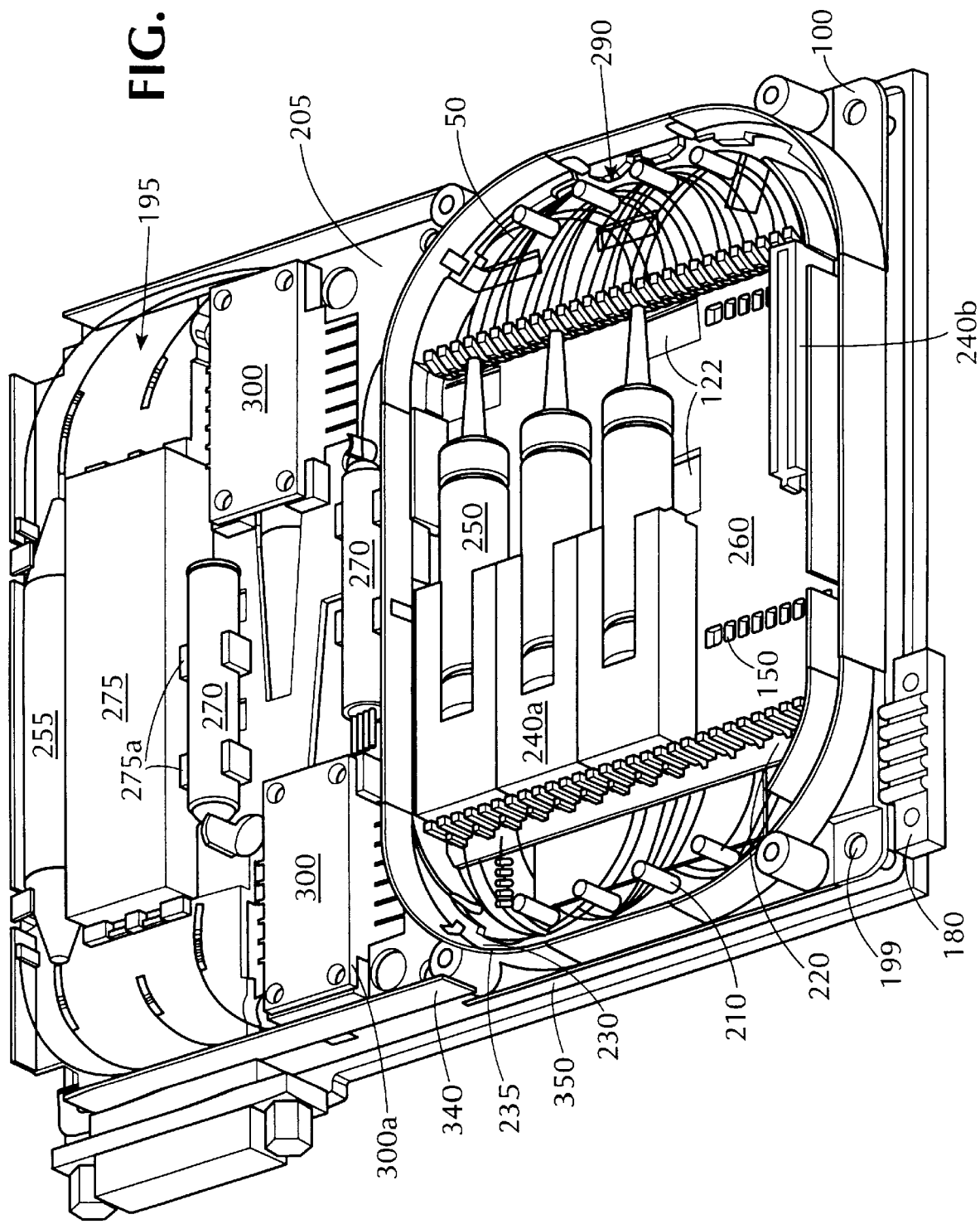
FIG. 2 is a perspective bottom view of the optical unit shown in FIG. 1.

Preferably, the interface 180, as shown in FIG. 2, is formed with grooves capable of better retaining the optical fiber at the apparatus entry and exit.

Once the fiber has entered the apparatus it is laid on the frame 100 and fixed thereto by fitting between some supports 175. Then it is caused to run along a trough 130 and maintained in place by tabs 135.

Then there are areas where splices, if any, are housed, completed with their protection jackets. In particular, area 160 enables housing of splices between two fiber lengths both when the fibers have the same diameter and when they have a different diameter, when for example one fiber has an external diameter of about 245–260 mm as it is currently employed within the apparatus, and one fiber has an external diameter of about 900 mm, being usually employed externally of the apparatus, since it is provided with an additional adhering protection ("tight" fiber) and therefore has a greater strength.

This type of splicing involves a single jacket which, due to the different sizes of the spliced fibers, has splicing portions having different external diameters. Thus the area 160 has one portion 160a, where the splicing portion of smaller diameter can be linked, preferably by a fitting system involving some supports 161 between which the splicing portions of smaller diameter are inserted, and one portion 160b devoid of supports, where the splicing portions of greater diameter can be disposed as they take the place occupied by the support thickness in portion 160a.

The area 160 is preferably provided close to the interface 180, since this type of splicing is mainly carried out with fiber lengths (provided with a tight coating having a diameter of about 900 mm) coming from the outside.

Figure 6:
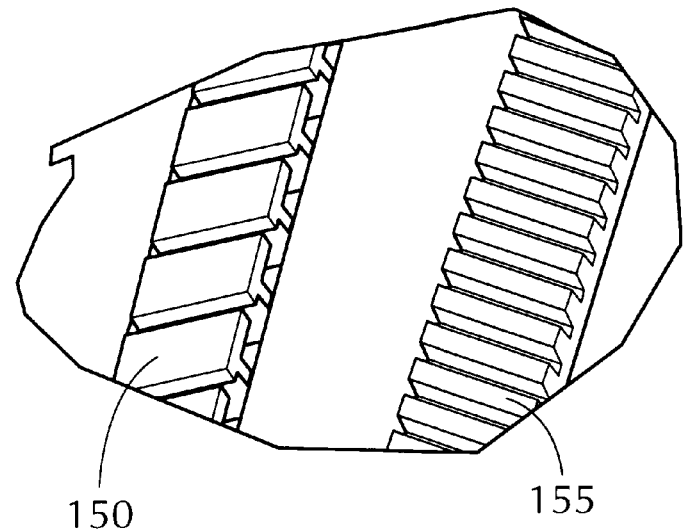
FIG. 6 is a detail of the optical unit shown in FIG. 1 and representing a pair of supports adapted to retain splices.

For splicings between fibers of same diameter, about 260 mm for example, a receiving area 140 is provided. Both the fiber portion preceding splicing and that following it are housed in an aligned manner, preferably by means of a fitting system consisting of a pair of supports, a T-shaped support 150 and a tooth-shaped support 155 respectively, as shown in FIG. 6, cooperation between them causing splices to be retained to the provided position within the area 140.

Preferably, another area 170 is also provided, where other splices are housed.

The arrangement of areas 140, 160 and 170 enables an easy handling of the optical fibers while the minimum mechanical effort is exerted thereon during the most delicate assembling step, which is the step involving execution of splicings by an appropriate machine (known per se and not described). To this purpose the container 110 is positioned alongside the splicing machine and once a splicing has been executed, it is moved to one of the receiving areas 140, 160, 170 that are preferably located close to the container 110 edge. Then pig-tails coming out of splices are easily inserted in the supports 150 and 155 being submitted to negligible bendings and each splice is thus fastened in alignment with the others and is made accessible individually.

The area 190 is further provided with a receiver 120 for receiving the surplus fiber which is necessary to enable possible repetition of splicings when they are either imperfect or damaged or need to be moved, or possible displacements of fiber lengths, from the apparatus to the splicing machine for example, for carrying out splicing (usually for this operation at least a 20 cm fiber length is necessary). The surplus fiber is maintained in place by holding tongues 122 essentially located in the receiver 120. In addition a holding band 124 is present and it extends from one end to the other of the receiver 120, being preferably fastened by a forced fitting device 127 in the middle and forming, in cooperation with some of the tongues 122, loops 125. Loops 125 facilitate the arrangement of the fibers under the tongues and band, the fibers being fixed in the receiver 120 so that on opening of the casing the surplus fiber does not spring out of the receiver, which will make operations on the optical unit less easy. In addition, due to its size, the receiver 120 enables the winding direction of the fiber to be reversed without imposing small radii of curvature which are harmful to the fiber. This is made necessary when components are used, for example, that have the fiber entry and exit physically located on the same side.

Typically the frame is an almost monolithic element made of plastic material by molding, mechanical machining or the like.

In addition, the area 190 has a plurality of openings that cannot be directly seen in the figures but are present at portion 1 for example, and enable passage of the fibers to the other partition areas of frame 100.

Preferably some holes 199 are formed to enable passage of fastening means such as screws, for fixing the frame 100 to the container 110.

The elements present in the area 195 will be described later with reference to FIG. 2 showing the frame 100 from the bottom. In this case the container 110 has been removed and it is possible to see both an electronic unit 150 and the optoelectronic apparatus cover 340.

In the lower part of frame 100 there are two areas, i.e. area 195 mainly containing the electro-optical components and shown in FIG. 1 too, and an area 290 disposed close to the upper part of area 190 where mainly both active and passive optical components are gathered.

Since both areas 190 and 290 are made in opposition on the same portion of the frame 100 by means of molds, some raised elements present in the area 190 are also visible in the form of cavities such as teeth 150, in the area 290, and also tongues 122.

In particular a seating 230 is present and is preferably disposed along the peripheral portion of area 290, in which preferably active fiber as long as 50 m can be gathered. This fiber is wound in the form of a toroidal coil, for example automatically, over shaped circular pulleys to facilitate extraction of the fiber torus without disarranging it. Preferably the fiber coil has its minimum circumference at least one mm greater than the minimum path of the appropriate seating 230 in which the coil is disposed loosely.

To keep the fiber coil more easily in place in the frame 100, the use of an element 235 is provided that, by running over the seating 230, reduces the width thereof and prevents the fiber from undesirably coming out.

Preferably a tray 260, of a substantially rectangular form is provided in the middle of area 290, being delimited over two opposite sides by two parallel portions of the seating 230 and over the remaining two sides by two substantially comb shaped elements disposed parallelly. Arranged in alignment within the tray 260 are passive optical components 250, such as isolators, couplers and filters.

The optical components are housed within cartridges 240, preferably of stiff plastic material such as nylon, having a standard external shape and bulkiness, adapted to be inserted by forced fitting into the tray 260 in an aligned relationship. Preferably, for cartridges 240 three different previously defined sections are adopted, of 4, 8 and 12 mm respectively, which values are multiples of a common value (4 mm) representing the periodicity enabling the tray 260 to dispose them in alignment. In this manner, for housing one component (250) having any size, a cartridge 240 is selected which has a pre-established section sufficient to hold it, then the inner seating of cartridge 240 is modified for housing it. Adapting the cartridge 240 to component 250 does not seem to be an expensive operation because when the component 250 section is changed, changing of the frame 100 mold for modifying the tray 260 is not required, the only change being that involving its insert 240.

Preferably the cartridge is a perforated element in the form of a parallelepiped, having an inner housing about 0.1–0.2 mm larger than the shape and size of component 250 and sufficient to enable insertion of component 250 on one side and exit of its pig-tail 50 on the opposite side. To reduce the overall bulkiness of the cartridge 240 and facilitate the assembling operations of the two elements (cartridge and component), of different geometric form, the cartridge 240 is provided with an opening from which part of the component 250 can emerge. In addition, cartridges 240 can have a different assembling system depending on the type of component they have to house. Therefore, a first type of cartridge 240a is provided which is formed of two equivalent parts (only one of which is shown in FIG. 2) which are mounted on both ends of the components 250 of greater size, optical isolators for example. A second type of cartridge 240b, instead, contemplates the presence of two superposed housings adapted to house components 250 of reduced sizes, directional or wavelength-selective couplers, for example.

Once mounting of component 250 to a cartridge 240 has been completed, the obtained element can be easily fastened to the inside of tray 260 by means of a fitting system with the aid of the comb shaped element 220 which is preferably fixed to the frame 100 by a fitting system. The empty space of the comb 220 enables passage of the pig-tail 50 emerging from cartridge 240, while the hooked shape of the comb teeth, by interacting with the projections present in the end portion of the cartridge 240, keep the latter in a locked position within the tray 260. Therefore, in order to maintain the pig-tails 50 extending between each comb 220 and the seating 230 in an orderly manner, said pig-tails are separated from each other by some cylindrical elements, four pins 210 on each side for example, as shown in FIG. 2.

Figure 7:
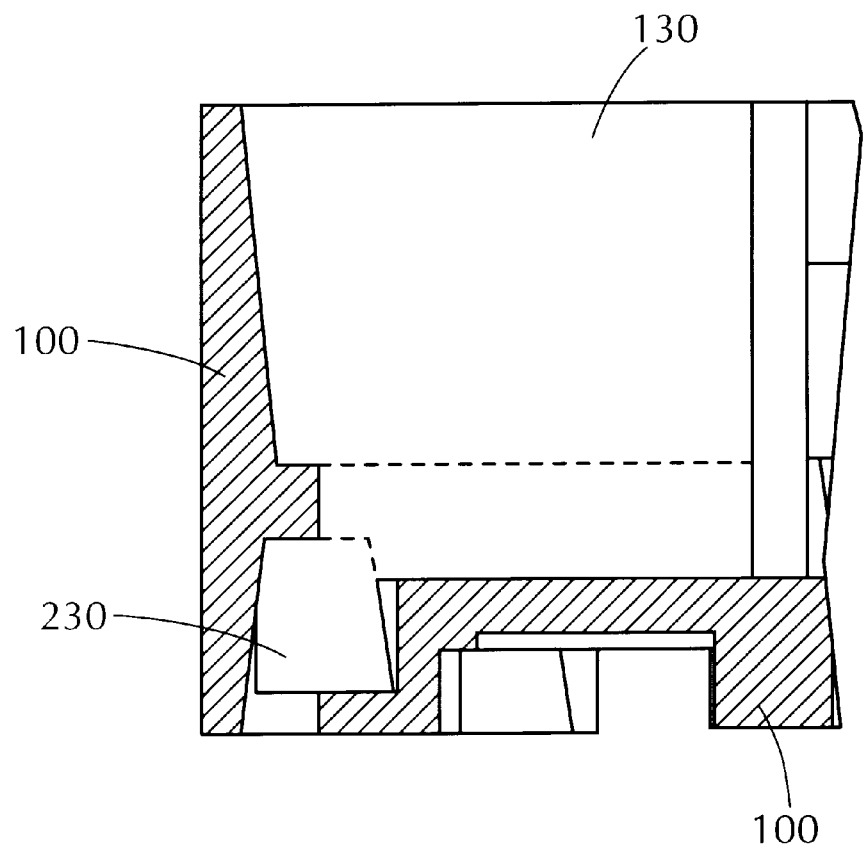
FIG. 7 is a detail of an opening for passage of the fibers from the upper part to the lower part of the optical unit shown in FIGS. 1 and 2.

Provided in the seating 230 are openings, as shown in FIG. 7, enabling an easier passage of the fiber from the lower area 290 to the upper area 190 in the seating 130, close to portion 1 in FIG. 1, for example. At these passage points an optical fiber laid on the bottom of seating 230 can pass to and lay on the bottom of seating 130 and vice versa, without inconvenient bendings being required, only a fiber translation for passing from one seating to the other being needed.

Other openings, not shown in the figure, enable the fibers to pass from area 290 to area 195.

Disposed within the area 195 are the electro-optical components of the device. Shown for example in FIG. 2 are a pair of semiconductor lasers 300, a pair of photodiodes 270 and a tunable optical filter 275. A free area is also available for inserting possible components for which there is not sufficient room in the areas expressly arranged. For example, in FIG. 2 this area is occupied by an additional optical isolator 255. These components are preferably fastened to the frame by forced fitting systems, such as the shaped teeth 275a, formed close to the components to be locked to make assembling and disassembling of said components easier, except for the semiconductor laser 300 that, having particular features, is fastened to the frame by an appropriate system to be described in more detail in the following with reference to FIG. 4. Thus gathering of all electrical contacts in one portion 205 of area 195 becomes easy.

In a different embodiment of the present invention, possible electro-optical components that did not find sufficient room in the area 195, can be disposed in some of the previously described areas.

Figure 3:
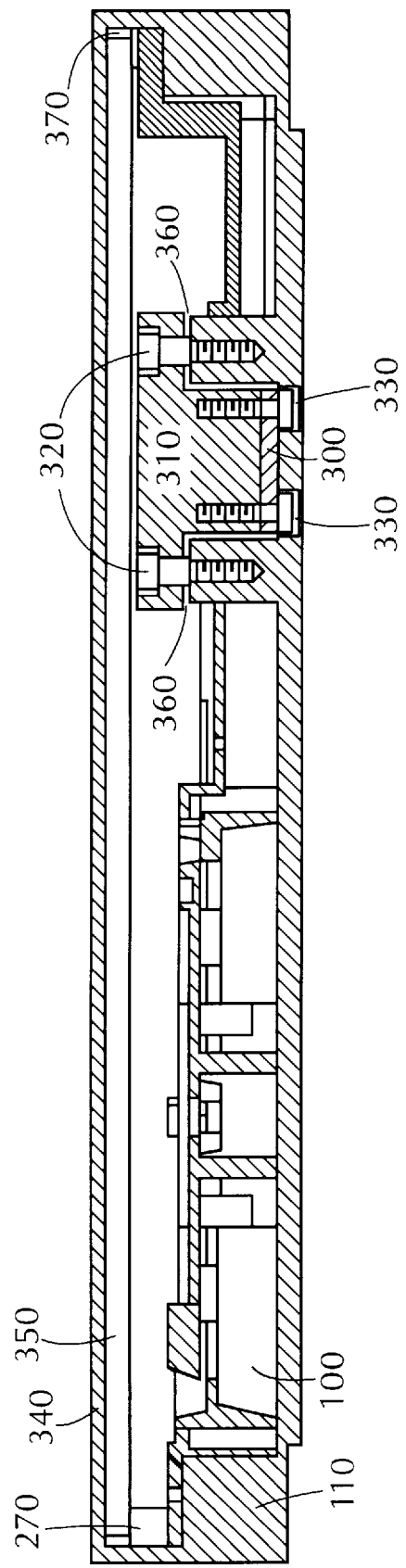
FIG. 3 shows an optoelectronic apparatus comprising the optical unit shown in FIG. 1, taken in section along line III—III in FIG. 1.

Shown in FIG. 3 is a section of the whole apparatus comprising the optical unit already described with reference to FIGS. 1 and 2 taken along line III—III in FIG. 1. The apparatus comprises the container 110 into which the frame 100, holding only some of the previously described components such as laser 300, is inserted. An electronic unit 350 is placed above the optical unit 100 but it is not in contact therewith, being preferably disposed externally of the container by means of a pair of spacers 370. The electronic unit 350 comprises elements adapted to enable feeding and control of the electro-optical components, such as the semiconductor lasers 300, photodiodes 270, tunable optical filter 275, in known manner. Alternatively, should feeding and control be carried out by equipments exterior to the apparatus, due to particular requirements, the electronic unit 350 can only comprise electric connections adapted to gather the different inputs and outputs of the electro-optical components on a multipolar conductor carried externally.

The connection means (not shown) between the optical 100 and electronic 350 units preferably is comprised of a conventional flat multipolar interface cable, long enough to enable connection to be maintained also when the electronic unit is temporarily removed, to enable inspection of the optical unit 100 for example during the testing steps. This cable therefore interconnects the electrical contacts gathered in the portion 205 of area 195 and the electronic unit 350.

The container 110 comprising the optical unit 100 is closed at the top by a cover 340, also comprising the electronic unit 350. Fastening of the whole assembly preferably occurs by conventional fastening means, screws for example, that pass through the cover 350 and the two units 100 and 350 by means of holes present in the respective structures (only holes 199 are shown in FIGS. 1 and 2), are screwed down to a suitably arranged portion of the container 110.

Figure 4:
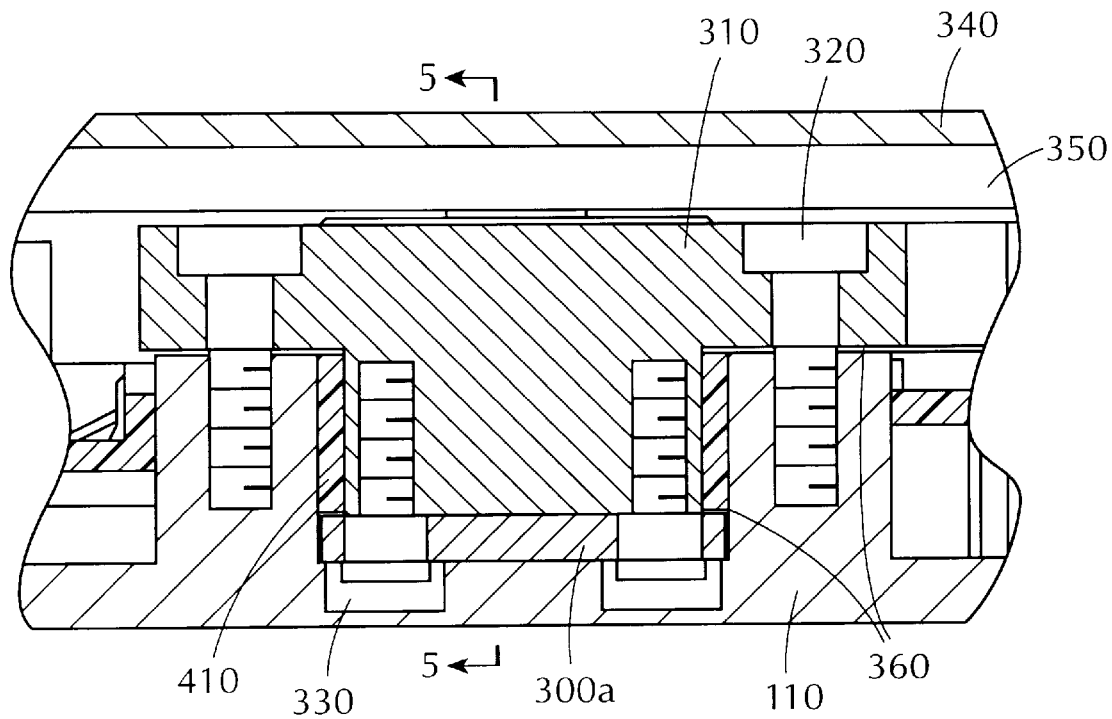
FIG. 4 is a detail of the view shown in FIG. 3, concerning an electro-optical component.
Figure 5:
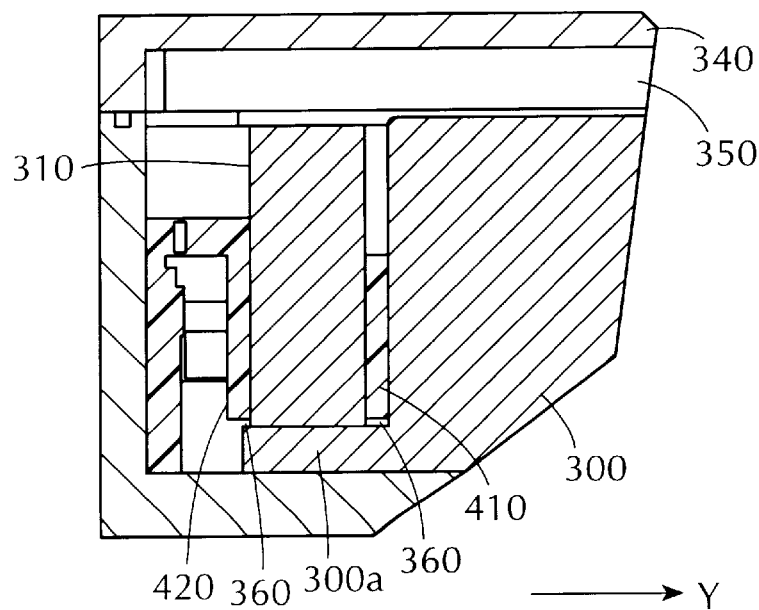
FIG. 5 is a sectional view of the electro-optical component shown in FIG. 4 taken along line V—V in FIG. 4.

The method of fastening the semiconductor laser 300 to frame 100 will be now described, with reference to FIGS. 4 and 5. However this method is also adapted for fastening different electro-optical components in an optoelectronic apparatus, which components, due to heat generated during operation of same, need to be thermally connected to the external container of the apparatus itself, in order to improve their heat dissipation.

First, laser, 300 connected by a connection fiber to one or more components integral with said optical unit, is inserted in the appropriate housing arranged on the frame 100. A pair of guides 410 and 420, preferably formed on the frame 100 during the molding step, is disposed close to this housing, which enable the laser to freely slide in a direction parallel to the direction Y shown in FIG. 5. Two substantially T-shaped metal supports 310, of aluminum for example, are fitted in this pair of guides, which can freely slide in the same direction Y as the laser. The supports are then secured by first fastening means, screws 330 for example, to laser 300. In particular, screws 330 link the support 310 leg with a flange 300a of laser 300. Consequently, cooperation between the laser 300 flanges on the one hand and the support 310 arms on the other hand for incorporating the guide 410 of lesser length than the support leg, enables the laser support (300–310) system to be fixed to the frame 100 with some clearance 360, preventing the laser support system from coming out of its seating in the frame 100 and from stressing the connection fiber in a dangerous manner. Preferably clearance 360 is between 0.2 mm and 0.4 mm. This first fastening system enables all tests on the optical unit to be carried out without it being necessary to complete the apparatus assembling and inhibit the laser, not yet conveniently linked, from coming out of its seating during this step, when the frame 100 is overturned for example.

Then the optical unit is inserted into the container 110 to which the laser support system (300–310) is fixedly linked, being in contact therewith, by second fastening means, screws 320 for example. In this case the clearance 360 present between the support 310 arms and the container 110 is reduced by pressure transmitted by the screws 320 to the arms that consequently will transmit to the central portion of the support 310 a force adapted to press the laser against the inner surface of the container 110, thereby improving the thermal contact thereof. Preferably, to improve thermal dissipation to the outside and make the apparatus stronger, the container 110 is made of metal, aluminum for example.

In accordance with the above description, the step of accomplishing the optoelectronic apparatus is particularly easy. In fact the optical unit is completed by disposing on the frame 100 all the necessary optical components, inclusive of lasers 300 exclusively fastened by means of screws 330. The electronic unit is assembled in a conventional manner not described. Once both the units have been made, they can be tested independently of each other. Then the optical unit is inserted in the container 110 and lasers 300 are definitively secured to the frame 100 and container 110 by screws 320. At this point the electronic unit is connected and superposed with the optical unit and the assembly is tested again. Should problems arise, the electronic unit 350 can be merely shifted to enable access to the optical unit without being obliged to remove the connection and the test can be carried out in this condition too. Once the test has been completed, the apparatus is closed by cover 340 and other screws carry out a final fastening.

I claim:

1. An optoelectronic apparatus comprising:
    a casing for containing an optical unit and at least one component having a high heat emission;
    first fastening means for linking said component with said optical unit and defining a first predetermined clearance between the optical unit and the component;
    second fastening means for linking said component with said casing in a thermal contact state and defining a second predetermined clearance; and
    wherein the first predetermined clearance is sufficient to allow a predetermined movement of the component and wherein the second predetermined clearance is less than said first predetermined clearance and substantially prevents the predetermined movement of the component.

2. An apparatus according to claim 1 further comprising support means cooperating with said first and second fastening means for linking said at least one component.

3. An apparatus according to claim 2, wherein said at least one component comprises at least one optical fiber for connection to one or more components integral with said optical unit.

4. An apparatus according to claim 3, wherein said first predetermined clearance is smaller than a value stressing said optical fiber in a detrimental manner and greater than a value inhibiting an appropriate thermal contact between said component and said casing once linked.

5. An apparatus according to claim 4, wherein said first fastening means provides for a linking between said at least one component and said support means and said second fastening means provides for a linking between said support means and said casing.

6. An apparatus according to claim 5, wherein said support means comprises at least one T-shaped element having one leg and two arms and said at least one component comprises one central body and one flange.

7. An apparatus according to claim 6, wherein said first fastening means provides for a linking between the flange of said at least one component and the leg of said T-shaped element, and said second fastening means provides for a linking between the arms of said element and said casing.

8. An apparatus according to claim 7, wherein said first and second fastening means comprise screws.

9. An apparatus according to claim 7, wherein said casing is made of a metal material.

10. A method of assembling an optoelectronic apparatus comprising a casing, the method comprising the following steps:
    disposing one component having a high heat emission on an optical unit of said apparatus;
    linking said component with said optical unit to define a first predetermined clearance between the component and the optical unit;
    inserting said optical unit into said casing; and
    linking said component with said casing in a thermal contact state to define a second predetermined clearance, wherein the first predetermined clearance is sufficient to allow a predetermined movement of the component and wherein the second predetermined clearance is less than said first predetermined clearance and substantially prevents the predetermined movement of the component.

11. A method according to claim 10, wherein in said linking said component with said optical unit step, first connecting means is applied between support means previously arranged on said optical unit and said component.

12. A method according to claim 11, wherein said step of linking said component in the thermal contact state comprises the application of second connecting means between said support means and said casing.

13. A method according to claim 12, wherein said first connecting means is for linking said component with said optical unit and wherein said second connecting means is for linking said component with said casing in the thermal contact state.

14. A method according to claim 10, wherein said linking said component with said casing further comprises linking said optical unit with said apparatus.

* * * * *